United States Patent
Dees et al.

(10) Patent No.: US 7,593,814 B2
(45) Date of Patent: Sep. 22, 2009

(54) ATTACHING MEASUREMENT DATA TO AN AREA MAP

(75) Inventors: Ian S. Dees, Aloha, OR (US); Lynne A. Fitzsimmons, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 505 days.

(21) Appl. No.: 11/361,445

(22) Filed: Feb. 24, 2006

(65) Prior Publication Data

US 2007/0203645 A1    Aug. 30, 2007

(51) Int. Cl.
*G01C 21/32* (2006.01)
(52) U.S. Cl. .................. 701/212; 701/208; 701/211
(58) Field of Classification Search .................. 701/200, 701/208, 211, 213–215; 340/988
See application file for complete search history.

(56) References Cited

U.S. PATENT DOCUMENTS

| | | | |
|---|---|---|---|
| 5,751,228 A * | 5/1998 | Kamiya et al. | 340/988 |
| 5,926,116 A * | 7/1999 | Kitano et al. | 340/988 |
| 6,437,797 B1 | 8/2002 | Ota | |
| 6,714,664 B2 * | 3/2004 | Kambe et al. | 382/113 |
| 6,741,790 B1 | 5/2004 | Burgess | |
| 6,906,643 B2 | 6/2005 | Samadani et al. | |
| 7,082,366 B2 * | 7/2006 | Arakawa | 701/210 |
| 7,454,090 B2 | 11/2008 | Wilcock et al. | |
| 7,492,996 B2 | 2/2009 | Kowalczyk et al. | |

FOREIGN PATENT DOCUMENTS

JP      2000-304774      11/2000

* cited by examiner

*Primary Examiner*—Yonel Beaulieu
(74) *Attorney, Agent, or Firm*—Francis I. Gray

(57) ABSTRACT

A method of attaching measurement data to an area map on the display of a test instrument includes importing a map for display covering a desired spatial region. Appropriate points of interest are overlaid on the map. A user selects measurement data to be attached to the map and, upon selection such as by "tapping" a touch sensitive screen, a measurement icon is positioned on the map where the selected measurement data was acquired. A thumbnail of the selected measurement data is overlaid on the measurement icon to show both the type of measurement and actual measurement results. Also indicia of quality/strength for the measured signal may be tagged to the measurement icon, such as by changing the color of the border of the measurement icon accordingly. A direction arrow may also be associated with the measurement icon to indicate an orientation of the test instrument when the measurement data was selected.

22 Claims, 5 Drawing Sheets

ATTACHING MEASUREMENT DATA TO AN AREA MAP

BACKGROUND OF THE INVENTION

The present invention relates to the displaying of measurement data, and more particularly to the attaching of measurement data to an area map to show the spatial location where each measurement was taken.

In the wireless telecommunications industry it is important for network operators to have a view of the network from the aspect of the subscriber. For example the Andrew® Invex3G® wireless coverage testing system plots on a geographic map of a region the quality of service in the form of a series of colored dots, the color representing the quality level at each measurement location as a user drives around the region. The measurement is taken using a conventional handset and accompanying processing hardware.

Likewise Summitek Instruments provides personal computer (PC) application software for spectrum monitoring and interference analysis (OASIS), which determines what radio frequency (RF) transmissions are present at a user's site, associates the emissions with a license and views the location of the identified emitter relative to the user's site on a geographical map. The geographical map also may indicate locations where measurements are taken. However, no measurements are associated with the identified emitter or measurement locations on the geographical map.

U.S. Pat. No. 6,906,643 describes how "path-enhanced" multimedia (PEM) data may be displayed, particularly on a "mapped-based view". The view includes iconic representations corresponding to multimedia recorded during a vacationeer's trip overlaid on a map of the region visited. The vacationeer's path through the region is shown and icons along the path corresponding to video, sound and photo are shown at the points where they were recorded. The recorded media can then be played back by "clicking" on a particular icon. The icon only represents the type of data recorded at the indicated points, and does not "show" a portion of what was actually recorded.

U.S. Pat. No. 6,741,790 provides for recording of GPS (Global Positioning System) data on the same medium as images are recorded by a video recording device. The device may then be connected to a computer where a geographic map is presented with an index representing each location recorded on the recording medium. Then any location may be selected and the images recorded at that location are played back by the video recording device. Again the data at each location is not known until it is activated.

For field measurement applications a user would like to know the spatial location of each measurement, what type of measurement data is recorded at each location, what the data is and what the quality/strength of the signal represented by the measurement data is, all from a single display.

BRIEF SUMMARY OF THE INVENTION

Accordingly embodiments of the present invention provide a method of attaching measurement data to an area map. A map mode and a measurement mode are selected. The area map for a desired region, either geographic, plat, floor plan or the like, is imported for display and points of interest, such as known signal emitters, are overlaid on the area map in the form of appropriate icons. When a user wishes to attach a measurement result to the area map, the user "taps" the screen and the measurement result is attached to the area map at the measurement location in the form of a measurement icon. The measurement icon is overlaid with a thumbnail of the actual measurement results and is tagged as to the quality/strength of the measured signal, such as by altering the color of the border of the measurement icon. In this way the user generates a display of measured results as spatially related to the desired region that shows type, actual data and quality/strength of the signal measured. Details of the measurement data at each location may be displayed by appropriately selecting the measurement icon at such location. Also, where desired, the direction in which the measurement is taken, i.e., orientation of the receiving antenna, may also be attached to each measurement icon.

The objects, advantages and other novel features of the present invention are apparent from the following detailed description when read in conjunction with the appended claims and attached drawing.

DETAILED DESCRIPTION OF THE INVENTION

Figure 1:
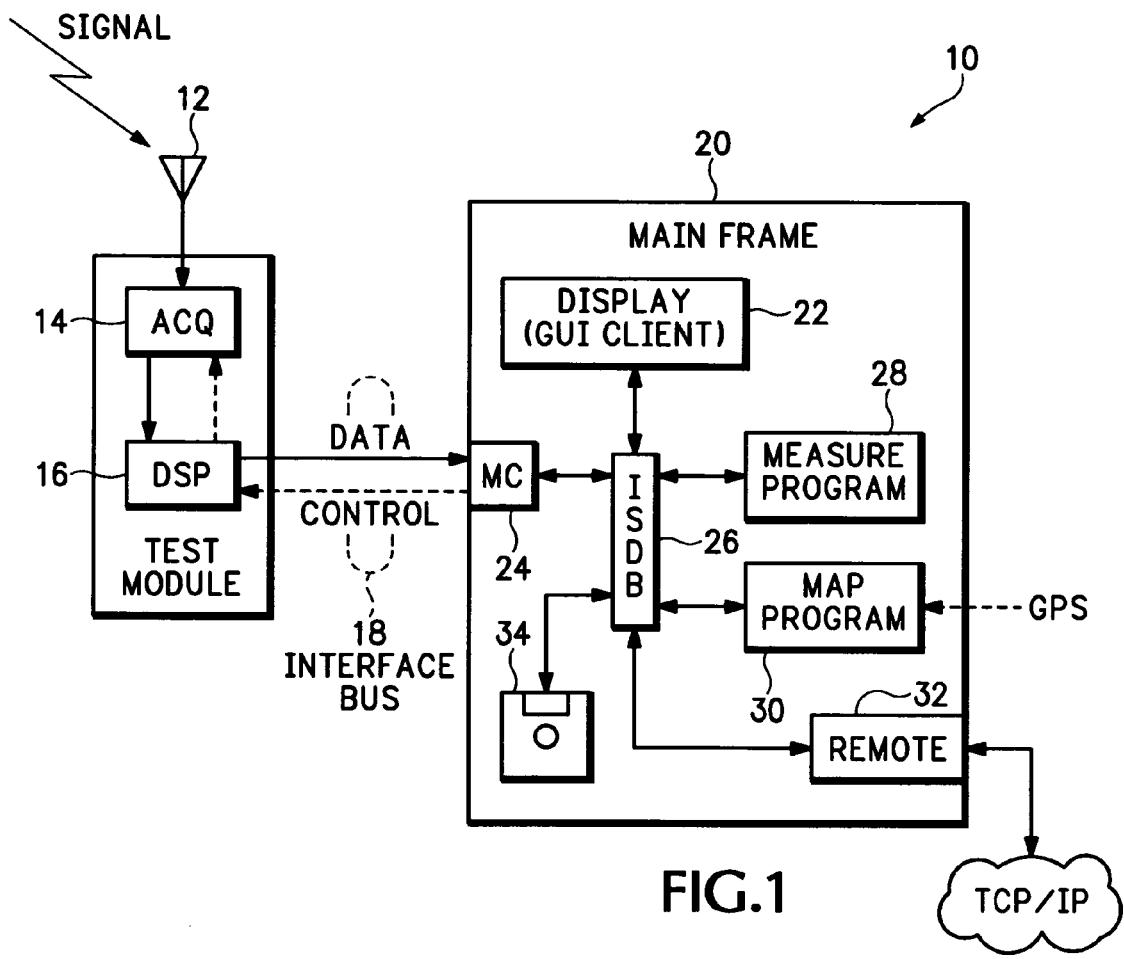
FIG. 1 is a block diagram view of an instrument for attaching measurement data to an area map according to the present invention.

Referring now to FIG. 1 a representative test instrument 10 is shown, such as the standalone, portable handheld Y400 NetTek® Analyzer with a YBT250 test module manufactured by Tektronix, Inc. of Beaverton, Oreg. An antenna 12 intercepts a signal which is input to an acquisition system 14. The acquisition system 14 provides pre-processing and digitization to produce a digital signal representative of the intercepted signal. The digital signal is provided to a digital signal processor (DSP) 16. The DSP 16 is connected to a digital bus 18 for communication with a main frame 20. The test module may be any type of test module, such as a spectrum analysis module, a demodulated measurements module and the like. The demodulated measurements module may include a PN code scanner, a code domain power processor, etc. The DSP 16 performs signal demodulation, makes measurements on the demodulated signal and generates responses to received commands. Commands from the main frame 20 are provided to the DSP 16 also over the digital bus 18. The DSP 16 may be implemented in many different ways, as is well known in the art, such as via a dedicated processor, an application specific integrated circuit (ASIC), a field programmable gate array (FPGA), a central processing unit (CPU) or the like. The test module may be a replaceable module, i.e., a particular module is mounted on the test instrument 10 according to the measurement desired as shown. Alternatively the test module may have the capability to perform multiple different measurements according to programs loaded into the DSP 16 from the main frame 20 over the digital bus 18. The particular measurement output to be processed by the main frame 20 is selected by a user via a graphics user interface (GUI). The selected measurement determines specified measurement criteria to be applied to the intercepted signal. A display 22, which may be part of the main frame 20, may provide the GUI, such as by having a touch sensitive screen or the like. Alternatively the housing for the test instrument 10 may include pushbuttons, switches, knobs and the like as the input/output interface.

As shown in FIG. 1 the main frame 20 interfaces with the DSP 16 via a measurement client (MC) module 24 which in turn interacts with an information state data base (ISDB) 26. The ISDB 26 is a collection of software objects derived from a common base class. All data is stored on the ISDB 26 from whatever source. The ISDB 26 interacts with a measurements program module 28, a map module 30, a remote interface module 32 for communication over a network, such as TCP/IP, and a storage module 34 for storing/retrieving permanent data. The MC module 24 receives measurement data from the DSP 16 and transmits commands to the DSP for configuration settings. The MC module 24 transfers received measurement data to the ISDB 26 and extracts commands for transmission to the DSP 16 from the ISDB. The ISDB 26 interacts with the measurements program module 28 for display processing of measurement results for presentation on the display 22. The ISDB 26 interacts with the map module 30 for importing and manipulating a selected map, which is then used by the display module 22 for presentation of the measurement results, as described below. The remote interface module 32 interacts with the ISDB 26 for providing remote commands, downloading information from an external source to the ISDB for use in one of the other modules 22, 28, 30, etc. Finally the ISDB 26 interacts with the storage module 34 for saving information and/or retrieving information as determined by the other modules.

Figure 2:
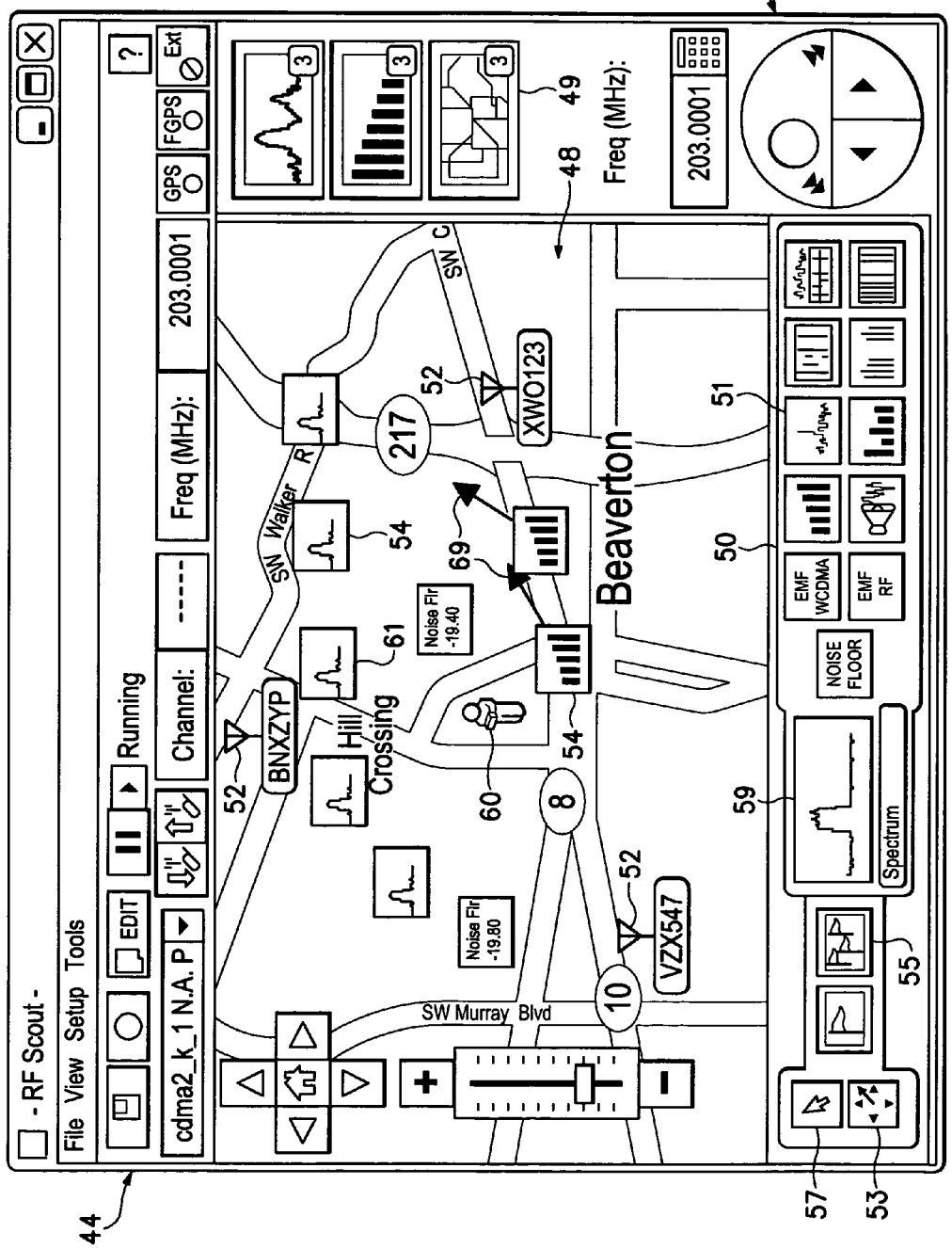
FIG. 2 is a display plan view of an area map with attached measurement data according to the present invention.

A representative display for the test instrument 10 is shown in FIG. 2 where a softscreen display 42 is shown having typical tool/information bars 44 at the top, an I/O interface 46 on along the right and bottom and a results window 48. An area map is shown in the results window 48 when a map view icon 49 in the I/O interface 46 is activated—this particular map being a geographic map although a plat map, a building floor plan or other type of area map may be used. The I/O interface 46 includes measurement "buttons" 50 that are representative views of measurements that may be made by the test instrument 10. For purposes of illustration a current measurement button 51 is selected for a spectrum analysis of the intercepted signal. Emitter icons 52 may be overlaid on the map at a location representing each known signal emitter. The emitter icons 52 may include a photo representation of the emitter or an iconic representation as shown. Also shown overlaid on the map are measurement icons 54 where actual measurements are taken. The measurement icons 54 are in the form of representations of actual measurements taken at the locations indicated, i.e., a noise floor figure, a spectrum analysis measurement thumbnail, code domain power, etc.

The placement of the measurement icons 54 on the map in the results window 48 may be achieved either by tapping the screen at the location of the measurement within the results window or by tapping the screen anywhere within the results window and letting a GPS positioning algorithm as part of the map module 30 correlate the current position of the test instrument 10 with a location on the map and placing the measurement icon at the GPS location. Alternatively the positioning of the measurement icons 54 may be based on other criteria, such as a desired distance or time relationship between measurements once the measurement process is started, again such as by tapping the screen within the results window 48 to indicate the start of the measurement process.

Figure 3:
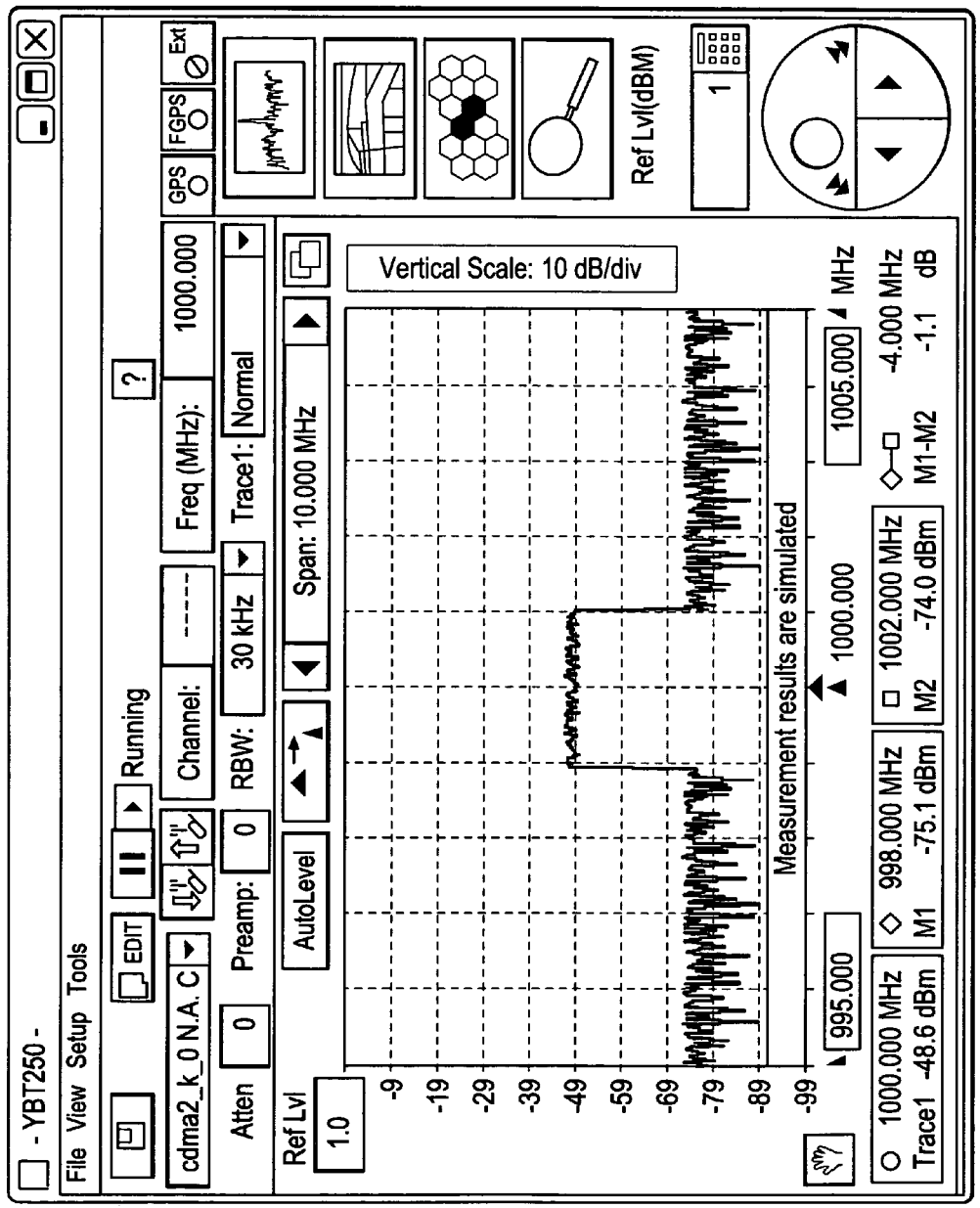
FIG. 3 is a display plan view of detailed measurement results associated with attached measurement data according to the present invention.

The test instrument 10 begins to make measurements according to the button 50 selected and a miniature readout window 59 within the I/O interface 46 shows the current measurement results. The known signal emitters 52 or other points of interest (POI) icons are overlaid on the map with a symbol representing the type of POI, and a current position icon 60 may also be overlaid on the map showing where the test instrument 10 is spatially with respect to the map. The test instrument 10 overlays a thumbnail 61 of the measurement results on the map as a measurement icon 54, either at a location determined by GPS (if available) or at a manually specified location as described above. The thumbnail indicates the type of measurement—spectrum traces resemble tiny spectrum analyzer screenshots, code domain power results resemble tiny bar graphs, etc. In fact the thumbnails may actually indicate the contents of the data, i.e., each spectrum thumbnail is a miniature version of the actual trace captured by the test instrument 10. Therefore the screenshot for each spectrum thumbnail is unique, and "clicking" on the thumbnail launches a full-screen window as shown in FIG. 3 presenting the full results in greater detail.

Some measurements have user-specified pass/fail criteria (max/min limits, spectrum masks, etc.) associated with them. The measurement icons 54 may be tagged with some indicia, such as by coloring or shading of the border, overlaying a miniature icon, etc., to indicate the "good", "bad" or "marginal" status of the data. The tagging may also be used to indicate strength or other characteristics of the signal being measured. Although not readily apparent in black and white, one measurement icon 54 may have a red border indicating failure of a specified criteria while another measurement icon may have a green border indicating meeting of the specified criteria. Yet another measurement icon 54 may have a yellow border indicating that the specified criteria are marginally met, i.e., in a region close to failing. In the spectrum analysis measurement this may indicate, for example, whether the signal has or has not violated a user-specified frequency mask or is close to violating the user-specified frequency mask. Further the border or miniature icon may be altered to indicate that the user has moved the measurement icon 54 from its measurement location for some reason, such as by providing cross-hatching for the border. Each measurement icon 54 is treated as a separate software object, and so may be moved by the user by interacting with the test instrument 10. The measurement icon 54 may subsequently be moved back to its original location on the map since the measurement location is permanently associated with the measurement icon, i.e., when the measurement icon is originally located on the map that position is permanently affixed to the measurement icon while a current position value may be altered when the icon is moved by the user.

Some measurements, such as for location of interfering emitters, may depend on the orientation of the antenna 12 for the test instrument 10. The user may then specify the direction in which the measurement was made by attaching a directional arrow 69 to the measurement icon 54. From the specified directions of two or more measurement locations the location of an interfering emitter may be located on the area map.

Figure 4A:
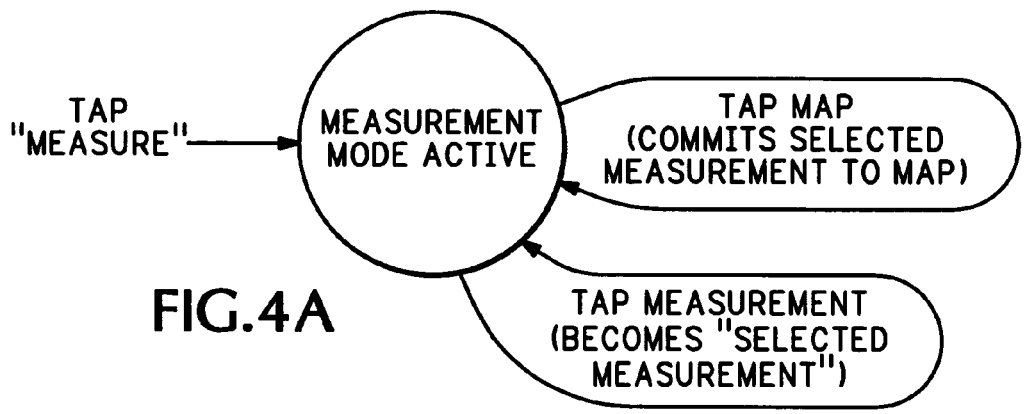
FIGS. 4a-4d are state diagram views related to attaching measurement data to an area map according to the present invention.
Figure 4B:
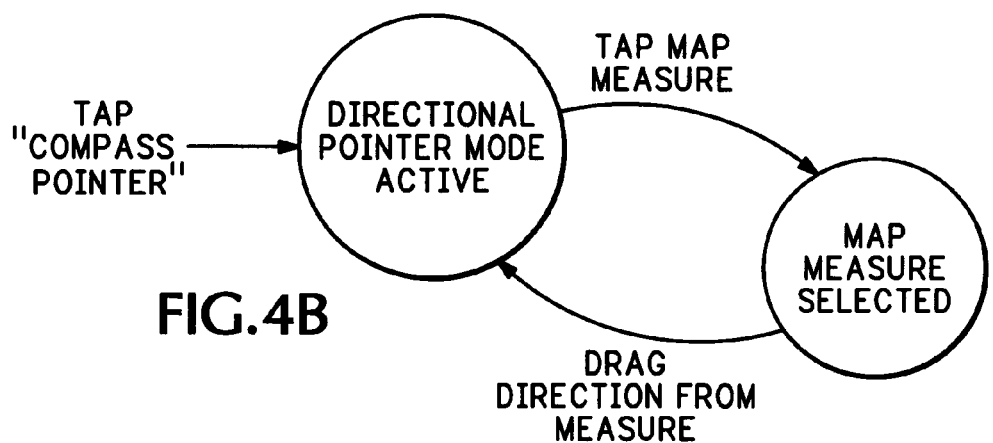
Figure 4C:
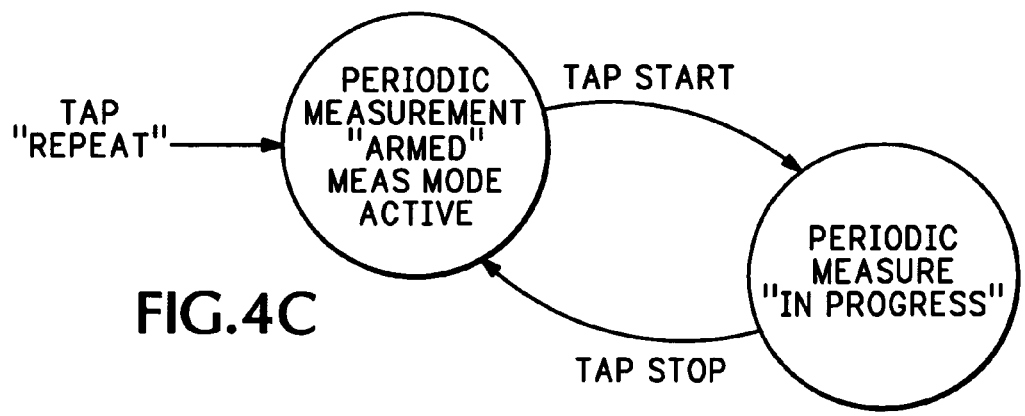

As shown in FIG. 4a a "tap" on a measurement button 50 causes the test instrument 10 to enter an active measurement mode. A further tap also serves to select the particular measurement and, when the tap is on the area map 48, may simultaneously, as described above, then serve to commit the selected measurement to the area map. A tap on a compass pointer button 53 causes the test instrument 10 to enter a directional pointer mode, as shown in FIG. 4b. A tap on one of the measurement icons 54 selects that map measurement, and then a drag from the measurement icon in the appropriate direction applies the directional arrow 69 to the measurement icon. According to FIG. 4c a tap on a repeat button 55 causes the test instrument to enter a periodic measurement mode. A tap then starts the periodic measurements, and a further tap stops the periodic measurements.

Figure 4D:
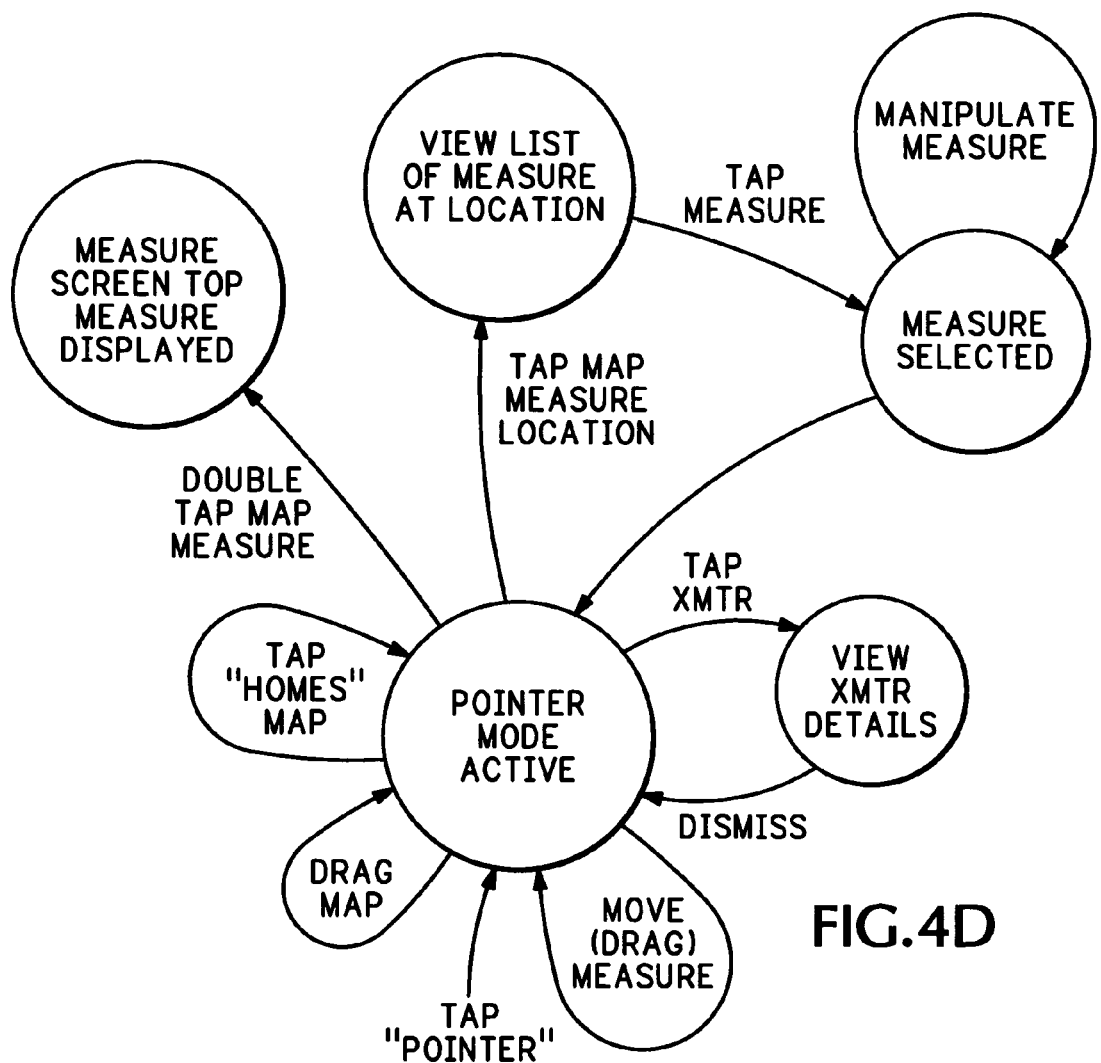

FIG. 4d further illustrates that a tap on a pointer button 57 causes the test instrument 10 to enter a pointer mode which allows several actions to be taken, including "homing" the map, dragging the map, moving one of the measurement icons, viewing transmitter details, replacing the map mode with a measurement screen (FIG. 3), viewing a list of measurements taken at a particular location including selecting a specified one of the measurements for manipulation, etc.

Thus the present invention provides a method of attaching measurement data to an area map so as to indicate, where appropriate, the measurement type, actual measurement results and quality/strength of the measured signal.

What is claimed is:

1. A method of attaching measurement data to an area map on a test instrument display comprising the steps of:
   importing the area map for the test instrument display;
   acquiring the measurement data from an intercepted signal according to specified measurement criteria;
   selecting the measurement data at a current position of the test instrument as selected measurement data to be attached to the area map; and
   overlaying a measurement icon on the area map, the measurement icon being situated on the area map at a location corresponding to the current position of the test instrument and including a thumbnail of the selected measurement data.

2. The method as recited in claim 1 wherein the thumbnail comprises an indicator of a measurement type for the selected measurement data.

3. The method as recited in claim 1 wherein the selecting step comprises the step of indicating on the area map the location of the current position of the test instrument to identify the measurement data at the current position as the selected measurement data.

4. The method as recited in claim 3 wherein the indicating step comprises the step of contacting the map at the location of the current position of the test instrument.

5. The method as recited in claim 3 wherein the indicating step comprises the steps of:
   providing a global position update for the current position of the test instrument; and
   contacting the map to identify the selected measurement data and to establish the global position update as the location of the selected measurement data for the overlaying step.

6. The method as recited in claim 3 wherein the indicating step comprises the steps of:
   specifying a criteria selected from the group consisting of distance and time to determine a frequency for selecting the measurement data as a plurality of selected measurement data; and
   contacting the map at the location where initial selected measurement data is acquired;
   whereby the overlaying step is repeated according to the specified criteria for each of the plurality of selected measurement data.

7. The method as recited in claim 1 further comprising the step of providing an indicia with the measurement icon of a characteristic of the intercepted signal represented by the selected measurement data.

8. The method as recited in claim 7 wherein the selecting step comprises the step of indicating on the area map the current position of the test instrument to identify the measurement data at the current position as the selected measurement data.

9. The method as recited in claim 8 wherein the indicating step comprises the step of contacting the area map at the current position of the test instrument.

10. The method as recited in claim 8 wherein the indicating step comprises the steps of:
    providing a global position update for the current position of the test instrument; and
    contacting the map to identify the selected measurement data and to establish the global position update as the location of the selected measurement data for the overlaying step.

11. The method as recited in claim 8 wherein the indicating step comprises the steps of:
    specifying a criteria selected from the group consisting of distance and time to determine a frequency for selecting the measurement data as a plurality of selected measurement data; and
    contacting the map at the location where initial selected measurement data is acquired;
    whereby the overlaying step is repeated according to the specified criteria for each of the plurality of selected measurement data.

12. The method as recited in claim 7 wherein the indicia comprises a tag associated with the measurement icon.

13. The method as recited in claim 12 wherein the tag comprises a border for the measurement icon having a color/shade indicative of the characteristic.

14. The method as recited in claim 13 wherein the characteristic comprises a signal strength and the color/shade is selected from a color/shade spectrum according to the signal strength, the color/shade spectrum ranging from a maximum signal strength to a minimum signal strength.

15. The method as recited in claim 13 wherein the characteristic comprises a quality value and the color/shade selected from a set of colors/shades.

16. The method as recited in claim 15 wherein the set of colors/shades is selected from a group representing meeting a specified criteria, failing to meet the specified criteria and being marginal in meeting the specified criteria.

17. The method as recited in claim 7 further comprising changing the indicia when the measurement icon is moved from the point to another location on the map to indicate that the measurement icon is no longer at the point where the measurement data was acquired.

18. The method as recited in claim 1 further comprising the step of associating a directional indicator with the measurement icon to indicate a direction from which the selected measurement data is acquired.

19. The method as recited in claim 7 further comprising the step of associating a directional indicator with the measurement icon to indicate a direction from which the selected measurement data is acquired.

20. An apparatus for attaching measurement data to an area map on a test instrument display comprising:
    means for importing the area map for the test instrument display;
    means for acquiring the measurement data from an intercepted signal according to specified measurement criteria;
    means for selecting the measurement data at a current position of the test instrument as selected measurement data to be attached to the area map; and
    means for overlaying a measurement icon on the area map, the measurement icon being situated on the area map at a location corresponding to the current position of the test instrument and including a thumbnail of the selected measurement data.

21. The apparatus as recited in claim 20 further comprising means for associating with the measurement icon an indicia of a characteristic of the selected measurement data.

22. The apparatus as recited in claim 20 further comprising means for providing an indicator associated with the measurement icon to provide an orientation of the test instrument at the current location.

* * * * *